(12) United States Patent
Aneja et al.

(10) Patent No.: US 10,678,635 B2
(45) Date of Patent: Jun. 9, 2020

(54) MEMORY MANAGEMENT

(71) Applicant: Intel Corporation, Santa Clara, CA (US)

(72) Inventors: Amit Aneja, Chandler, AZ (US); Jorge Serratos Hernandez, Zapopan (MX); Bruno Achauer, Zaberfeld (DE)

(73) Assignee: INTEL CORPORATION, Santa Clara, CA (US)

( * ) Notice: Subject to any disclaimer, the term of this patent is extended or adjusted under 35 U.S.C. 154(b) by 42 days.

(21) Appl. No.: 15/864,004

(22) Filed: Jan. 8, 2018

(65) Prior Publication Data

US 2019/0050331 A1 Feb. 14, 2019

(51) Int. Cl.
| | | |
|---|---|---|
| *G06F 11/10* | (2006.01) | |
| *G06F 9/4401* | (2018.01) | |
| *G11C 29/52* | (2006.01) | |
| *G06F 12/0888* | (2016.01) | |
| *G11C 29/04* | (2006.01) | |

(52) U.S. Cl.
CPC .......... *G06F 11/106* (2013.01); *G06F 9/4401* (2013.01); *G06F 12/0888* (2013.01); *G11C 29/52* (2013.01); *G06F 9/4406* (2013.01); *G06F 2212/1052* (2013.01); *G11C 2029/0409* (2013.01)

(58) Field of Classification Search
CPC ......... G11C 2029/0409; G06F 11/1048–2284; G06F 9/4401–44589; G06F 12/12–128; G06F 11/1417; G06F 12/0804; G06F 3/0631
See application file for complete search history.

(56) References Cited

U.S. PATENT DOCUMENTS

| | | | | |
|---|---|---|---|---|
| 5,860,140 | A * | 1/1999 | Abbott | G06F 11/3466 711/202 |
| 7,246,269 | B1 * | 7/2007 | Hamilton | G06F 11/106 714/42 |
| 7,330,959 | B1 * | 2/2008 | Anvin | G06F 12/0804 711/202 |
| 10,089,116 | B2 * | 10/2018 | Valasek | G06F 9/4403 |
| 10,168,936 | B2 * | 1/2019 | Chinnakkonda Vidyapoornachary | G11C 29/52 |
| 2011/0131399 | A1 * | 6/2011 | Sainath | G06F 11/106 713/2 |

OTHER PUBLICATIONS

"Ram drive", Dec. 31, 2016, Wikipedia, revision from Dec. 31, 2016, pp. 1-5 https://en.wikipedia.org/w/index.php?title=RAM_drive&oldid=757613454 (Year: 2016).*

* cited by examiner

*Primary Examiner* — Reginald G Bragdon
*Assistant Examiner* — Curtis James Kortman
(74) *Attorney, Agent, or Firm* — Viering, Jentschura & Partner MBB

(57) ABSTRACT

A system for managing memory resources related to boot, including a memory; a boot configuration circuit, configured to designate one or more memory regions as a first type or a second type, the first type requiring scrubbing before beginning system operation, and the second type permitting scrubbing after beginning system operation; one or more processors, configured to scrub the memory regions of the first type; define a first caching policy of one or more memory regions of the second type; and begin system operation before scrubbing memory regions of the second type.

20 Claims, 5 Drawing Sheets

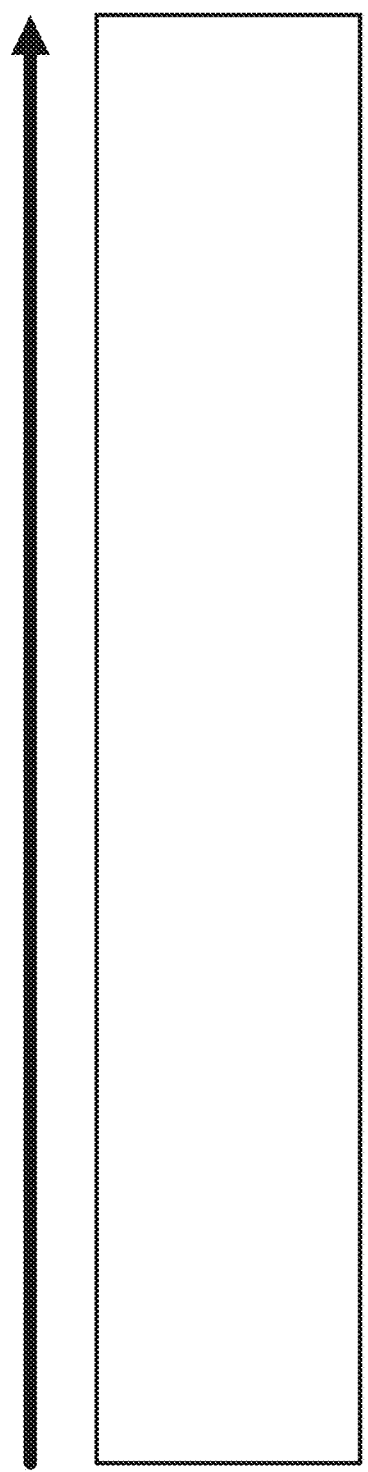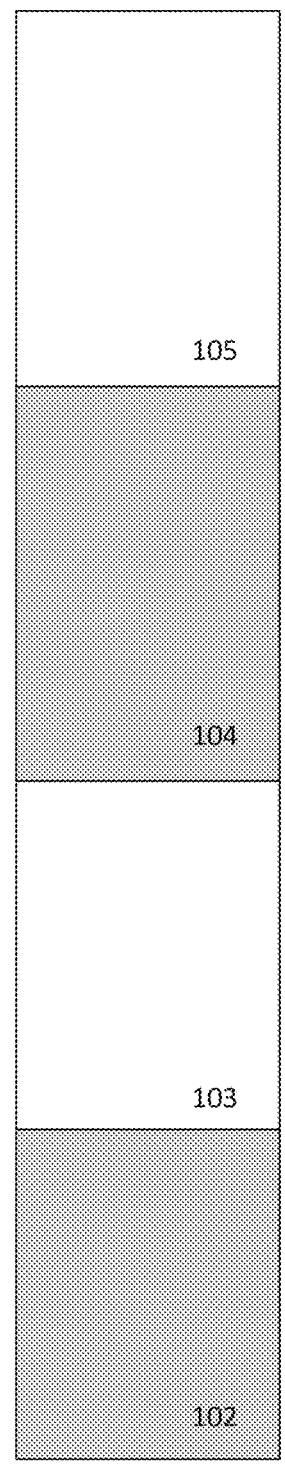
Fig. 1
Fig. 2

MEMORY MANAGEMENT

TECHNICAL FIELD

Various aspects of the disclosure relate generally to memory management during system boot-up.

BACKGROUND

Autonomous driving systems, or driving systems with automated driver assistance mechanisms, may be required to be capable of a fast-boot, which may require a boot-up process to be sufficiently complete, such that a corresponding application may be initiated within a predetermined duration of initializing a boot operation. For example, it is known to require the rear-view camera to be operational within two seconds of initializing a boot operation or to perform service discovery within a predetermined time after initializing a boot. Related to the fast-boot requirement, it is known to overwrite or "scrub" DRAM memory before system operation. Furthermore, Error Correction Code (ECC) DRAM memory, which provides a function safety measure against potential memory channel errors, necessitates scrubbing DRAM memory before using. This memory scrubbing may be a comparatively slow process that demands a significant portion of the timing budget corresponding to the predetermined period after startup. Thus, it is desirable to reduce the time that memory scrubbing requires within the startup timing budget.

SUMMARY

Herein is disclosed a memory management system comprising a memory; a boot configuration circuit, configured to designate one or more memory regions as a first type or a second type, the first type requiring scrubbing before beginning system operation, and the second type permitting scrubbing during system operation; one or more processors, configured to scrub the memory regions of the first type; define a first caching policy of one or more memory regions of the second type; and begin system operation before scrubbing memory regions of the second type.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIG. 1 shows a an unclassified memory for an autonomous vehicle for scrubbing;

FIG. 2 shows a memory for an autonomous vehicle designated into memory of a first type and memory of a second type;

DESCRIPTION

Figure 3:
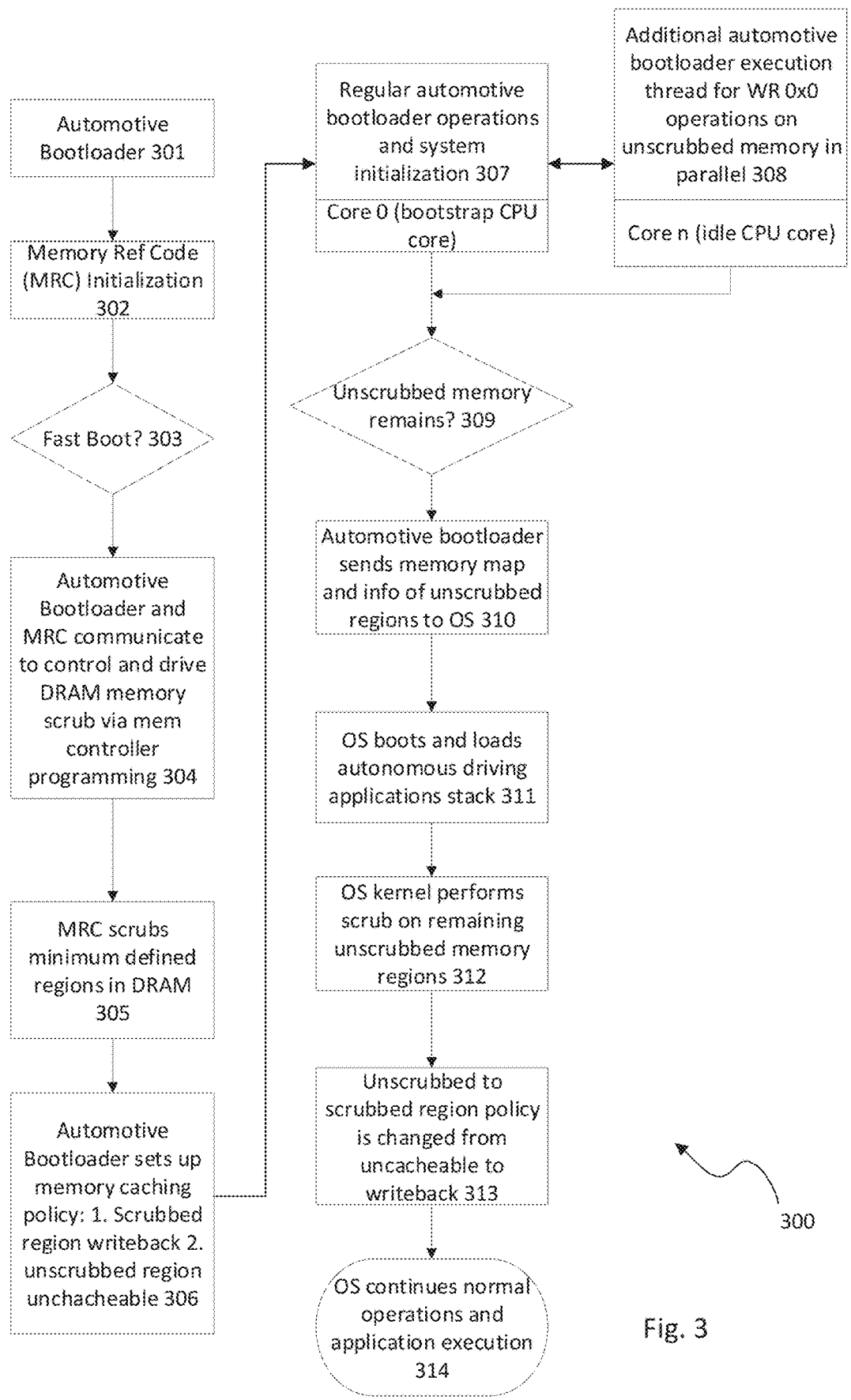
FIG. 3 shows a decision chart for a memory management system according to an aspect of the disclosure.

The following detailed description refers to the accompanying drawings that show, by way of illustration, specific details and aspects in which the disclosure may be practiced. These aspects are described in sufficient detail to enable those skilled in the art to practice the disclosure. Other aspects may be utilized and structural, logical, and electrical changes may be made without departing from the scope of the disclosure. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The word "exemplary" is used herein to mean "serving as an example, instance, or illustration." Any example or design described herein as "exemplary" is not necessarily to be construed as preferred or advantageous over other examples or designs.

Throughout the drawings, it should be noted that like reference numbers are used to depict the same or similar elements, features, and structures.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more. The terms "proper subset", "reduced subset", and "lesser subset" refer to a subset of a set that is not equal to the set, i.e. a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term data, however, is not limited to the aforementioned examples and may take various forms and represent any information as understood in the art.

The term "processor" or "controller" as, for example, used herein may be understood as any kind of entity that allows handling data, signals, etc. The data, signals, etc. may be handled according to one or more specific functions executed by the processor or controller.

A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit ("ASIC"), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "system" (e.g., a drive system, a position detection system, etc.) detailed herein may be understood as a set of interacting elements, the elements may be, by way of example and not of limitation, one or more mechanical components, one or more electrical components, one or more instructions (e.g., encoded in storage media), one or more controllers, etc.

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit ("CPU"), Graphics Processing Unit ("GPU"), Digital Signal Processor ("DSP"), Field Programmable Gate Array ("FPGA"), integrated circuit, Application Specific Integrated Circuit ("ASIC"), etc., or any combination thereof. Any other kind of implementation of the respective functions which will be described below in further detail may also be understood as a "circuit." It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

As used herein, "memory" may be understood as a non-transitory computer-readable medium in which data or information can be stored for retrieval. References to "memory" included herein may thus be understood as referring to volatile or non-volatile memory, including random access memory ("RAM"), read-only memory ("ROM"), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component including one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

FIG. 1 shows a system memory for an autonomous vehicle during startup 100. The system memory is depicted herein as an undivided memory that is scheduled for scrubbing upon startup. That is, when a motor vehicle startup is activated, the entire memory must typically be "scrubbed," most commonly by overwriting with zeros, to clear the memory of any residual or unwanted data. As a brief illustration of this point, every 64 bits of DRAM memory may include 8 bits of ECC, which are saved on a separate DRAM memory area. A failure to scrub the memory can result in the ECC memory bits remaining random or in an unknown state. A use of these DRAM bits by the processor or CPU will result in an ECC error that will require the processor to cease operation and therefore halt system operation. Thus, it is necessary to perform memory scrubbing during the booting process. Memory scrubbing is a labor-intensive process that requires significant time. In light of the tight timing budget for system application initialization, such as the two-second goal to initialize a rear-view camera, the process of memory scrubbing may require too great a portion of the overall timing budget.

FIG. 2 shows a system memory for an autonomous vehicle during startup according to an aspect of the disclosure 101. The memory 101 has been divided into subsections of a first type 102 and 104 and of the second type 103 and 105. The first type is indicated as a darker shaded region. The first type of memory is designated as memory that must be scrubbed before system operation or before the system is booted up. The second type of memory is memory for which the scrubbing may occur during or after system operation or once the system is booted up. According to one aspect of the disclosure, the memory is divided into regions according to the first type and the second type at or prior to startup. Upon startup, the first type of memory is scrubbed. The system operation is begun after scrubbing the first type of memory, and before beginning scrubbing the second type of memory. The second type of memory is scrubbed during and subsequent to the beginning of system operation, as described herein.

FIG. 3 depicts a decision chart for a memory management system according to an aspect of the disclosure. Upon system startup, an automotive bootloader 301 (hereinafter "bootloader") is initiated. The bootloader 301 manages the aspects of memory scrubbing, at least prior to system being operational. The bootloader 301 performs a memory reference code (MRC) initialization 302 in which memory is designated by region as being memory of either the first type (requiring scrubbing before system operation or before the system is booted up) or of the second type (being able to be scrubbed during or after system operation or boot-up). It may be determined whether a fast boot 303 will be attempted. A fast boot 303 corresponds to the methods described herein, wherein a second type of memory is not scrubbed at least until system is operational. Where a fast boot 303 is performed, the automotive bootloader and MRC communicate to control and drive memory scrubbing via the memory controller programming 304. The MRC 305 scrubs the memory of the first type. The bootloader implements a memory caching policy, such that scrubbed memory is designated as writeback memory, and unscrubbed memory is designated as unchacheable memory 306. Thus, because it is anticipated that memory of the first type will be scrubbed in this period, memory of the first type is designated as writeback memory, and memory of the second type is designated as unchacheable memory. The designation of memory as unchacheable protect the system from unscrubbed memory by preventing any residual or unwanted data in the unscrubbed memory from being moved to the Cache. The distinction between the first memory type and second memory type may be configurable for a desired implementation. That is, the distinction between the first memory type and second memory type may be configurable, such that the amount or location of memory designated as the first type or second type can be altered or varied. The designation may be made based on one or more default parameters or tolerances, which may be configurable. Before production of a given system implementation, an automobile manufacturer or system designer may be able to control or define said default parameters or tolerances to alter the relative apportionment of memory as memory of the first type and memory of the second type. The bootloader may provide the MRC with these parameters or tolerances, and the MRC will perform memory scrubbing via memory controller programming accordingly.

Once the memory has been designated as memory of a first type or second type, the first type memory has been scrubbed, and the cache-protection has been implemented for the second type unscrubbed memory, the regular bootloader operations and system operation 307 commence. In the known method of system operation for autonomous vehicles, the system operation does not commence until the entirety of the memory is scrubbed, and thereby this represents a departure from the known method of system operation. The primary CPU performs the system operation. The primary CPU is unable to perform additional memory scrubbing while the system is becoming operational. However, it is known that other CPUs may be idle in the context of the system becoming operational, and therefore one or more additional CPUs may be used to perform memory scrubbing of the second type during system operation performed by the primary CPU, as described in 308.

Once the system is operational, it may be determined whether any unscrubbed memory of the second type remains 309. Where no additional unscrubbed memory remains, the issue of memory scrubbing requires no further attention, and regular operating system and application loading may commence.

Where memory of the second type remains unscrubbed upon the system being operational, the automotive bootloader sends a memory map of the unscrubbed memory regions to the operating system 310. With this step, the operating system is apprised of any regions of unscrubbed memory, such that the operating system may cause these regions to be scrubbed.

The operating system then boots and loads the autonomous driving applications stack 311. Upon booting, the operating system kernel scrubs any remaining unscrubbed memory regions 310. Upon completion of this task, the memory of the second type is scrubbed, and the goal is achieved. Once the memory of the second type is scrubbed, the memory caching policy previously set for the unscrubbed regions is now changed from unchacheable two writeback 313. Having completed the memory scrubbing, the operating system may continue normal operation and application execution 314.

Figure 4:
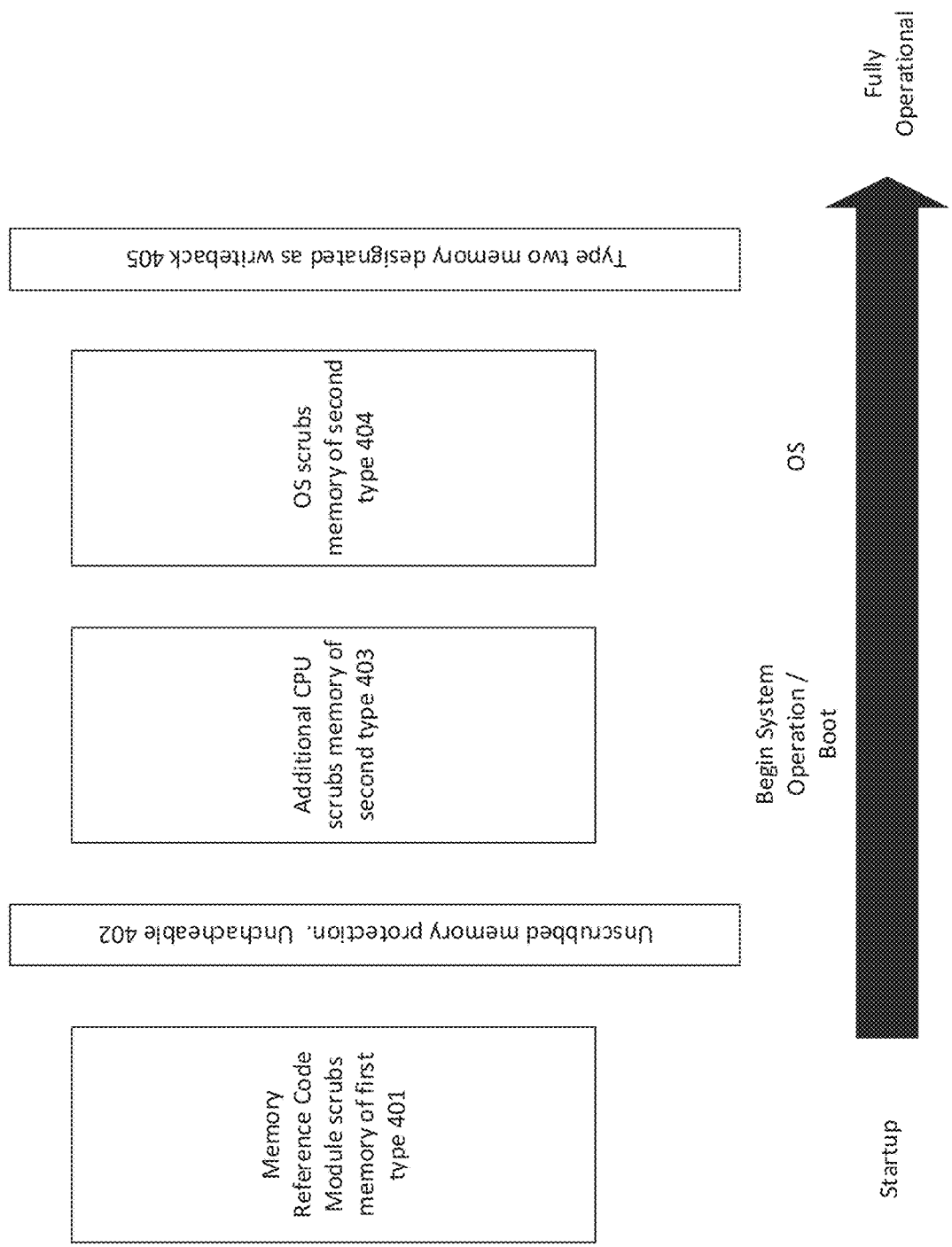
FIG. 4 shows a progression of modules with scrubbing tasks following startup.
Figure 5:
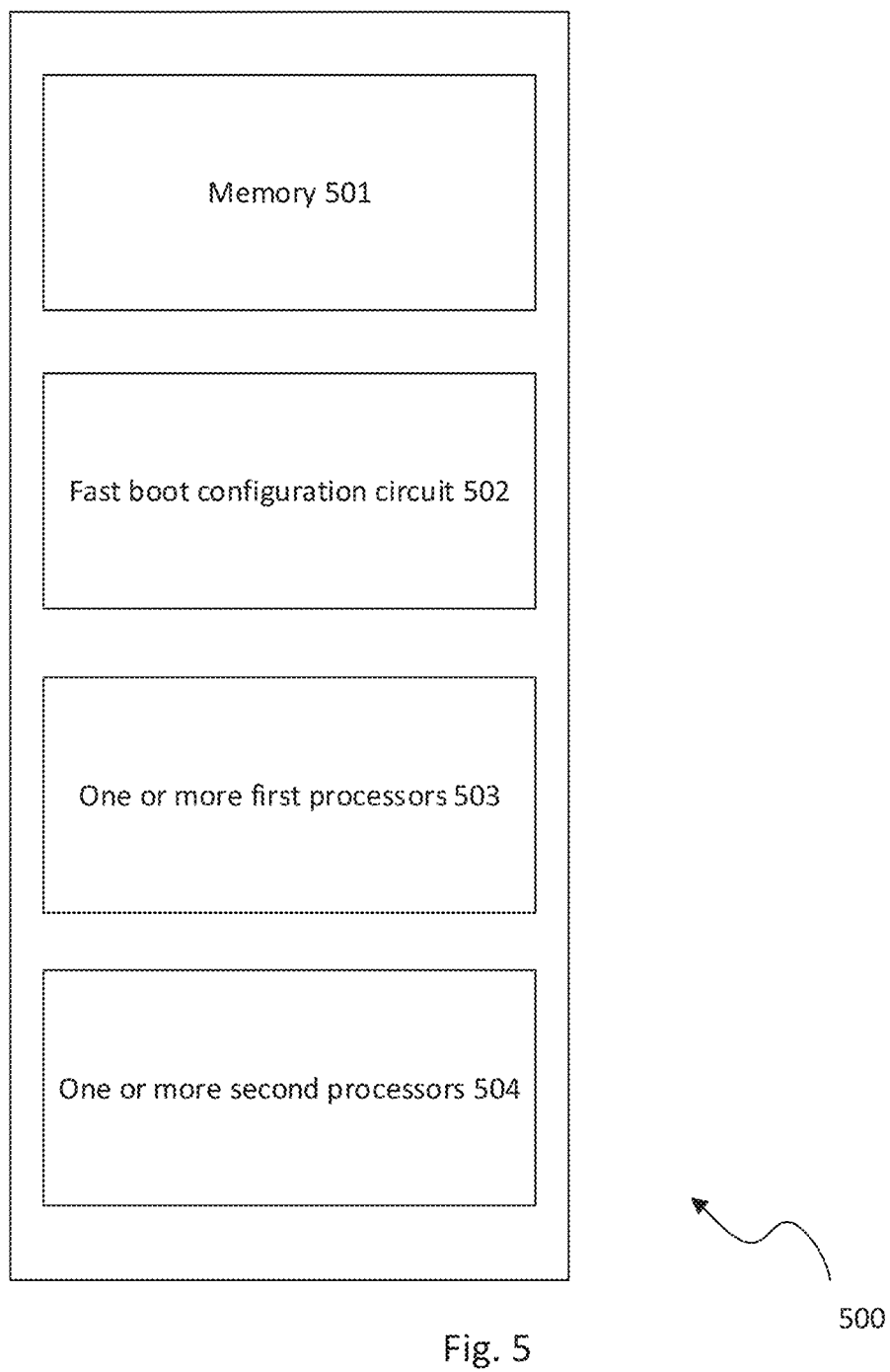
FIG. 5 shows a memory management system.

FIG. 4 shows a division of responsibility for scrubbing from startup to a fully operational system. Upon startup, the memory reference code module scrubs memory of the first type 401. The memory of the second type is then issued with a memory caching protection, such that the memory of the second type is designated as being unchacheable 402. While the system is becoming operational, the primary CPU may be unable to perform memory scrubbing tasks; however, one or more additional CPUs may be recruited to perform memory scrubbing tasks while the system becomes operational 403. The additional CPU may be any idle or otherwise available CPU, without limitation. Once the system is initialized, the OS may be loaded. The OS, once operational, is configured to scrub memory until the memory of the second type has been completely scrubbed 404. Upon completion of memory scrubbing, the memory caching protections are changed, and the portions of memory previously designated as "uncacheable" are changed to be designated as writeback memory 405.

The memory management system may include a memory 501; a fast boot configuration circuit 502, configured to designate one or more memory regions as a first type or a second type, the first type requiring scrubbing before beginning system operation, and the second type permitting scrubbing after beginning system operation; and one or more primary processors 503, configured to scrub the memory regions of the first type; define a first caching policy of one or more memory regions of the second type; and begin system operation before scrubbing memory regions of the second type. The system may further include one or more additional processors 504, configured to scrub an unscrubbed region of memory of the second type during the system operation. It is expressly noted that the use of one or more additional processors during the memory scrubbing operation may be elected depending on the availability of additional processors, the need for scrubbing of additional memory of the second type, or for any other reason. The use of additional processors for memory scrubbing should not be interpreted as being an indispensable portion of the memory management system described herein.

Figure 6:
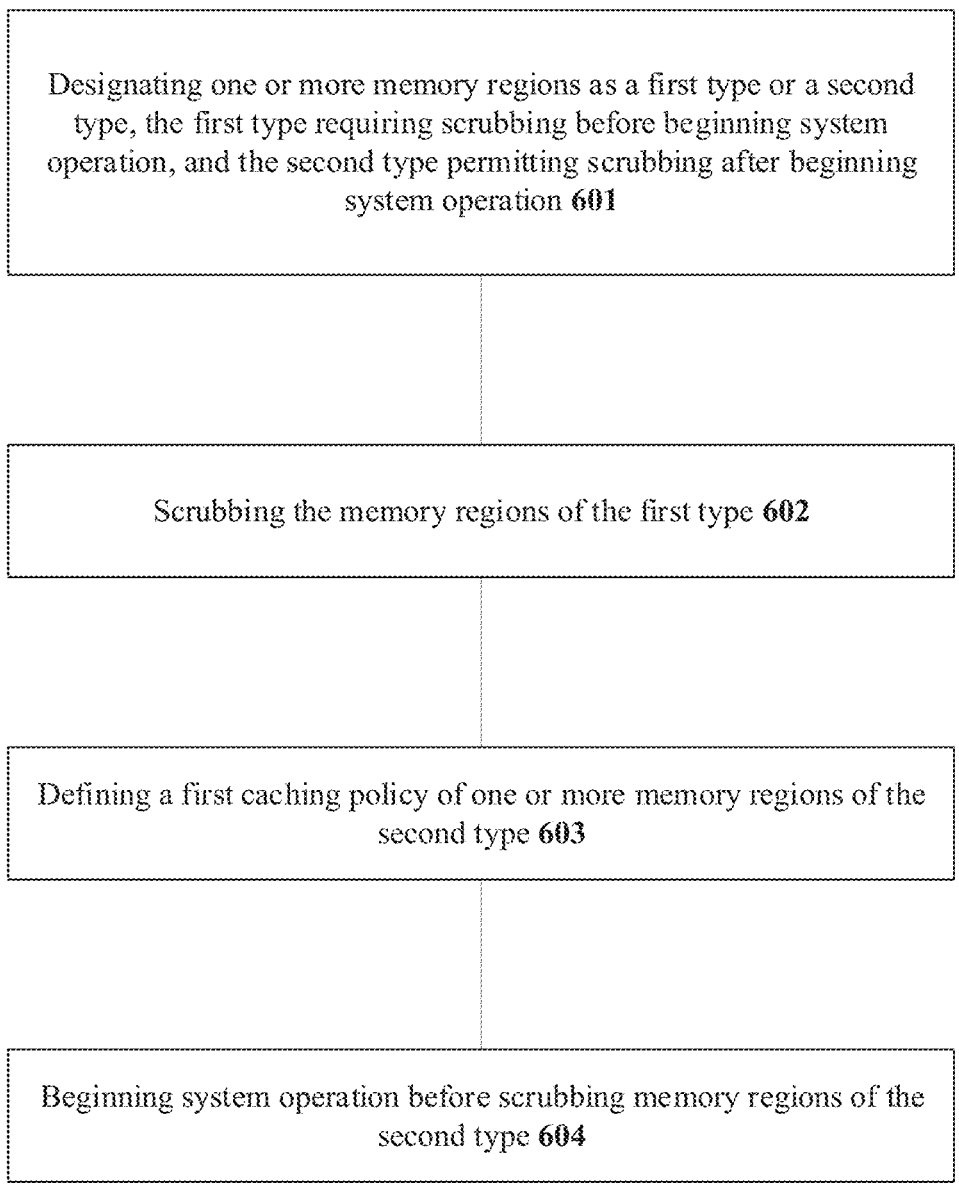
FIG. 6 shows a method for memory management.

FIG. 6 shows a method for memory management comprising designating one or more memory regions as a first type or a second type, the first type requiring scrubbing before beginning system operation, and the second type permitting scrubbing after beginning system operation 601; scrubbing the memory regions of the first type 602; defining a first caching policy of one or more memory regions of the second type 603; and beginning system operation before scrubbing memory regions of the second type 604.

As autonomous driving vehicles, or human-operated vehicles with autonomous driving functions, are developed, it is necessary to keep user safety in mind. Many standards are emerging with the aim of reducing vehicle malfunction or collision. One such standard is the requirement that a rear-view camera must operate within two seconds of vehicle startup. Operation of such a rear-view camera requires at least motor vehicle startup, system operation, operating system loading, application stack loading within the operating system, and initialization of the rear-view camera.

As described herein, and as a further safety measure, it is known to scrub the vehicle memory before system operation. The memory used in such vehicles may be capable of storing data for a period of time after the vehicle is shut off, and such data may be available to the vehicle again upon a subsequent startup. For improved system operation, it may be desirable to erase any residual data by overwriting it with a known value. Such overwriting insures a clean startup and eliminates the possibility of corrupted or undesirable data being transferred into the system cache.

The common methods of memory overwriting used in such vehicles present special challenges to comply with regulatory timing requirements, such as the two-second goal for rear-view camera initialization. Such memory overwriting techniques are often performed in small clusters or for a limited or comparatively small region of memory at a given time. Because the memory used in autonomous vehicles may be quite large, overwriting each region of memory is a cumbersome process that takes a significant portion of the available timing budget. It therefore becomes desirable to improve the memory management, such that additional time is afforded to the other steps necessary to achieve application initialization.

Rather than overwriting or scrubbing the entirety of available memory prior to system operation, it is disclosed herein to designate the available memory as memory of a first type or a second type. Memory of the first type is memory that is designated as requiring scrubbing prior to system operation, and memory of the second type is memory that may be scrubbed during or following system operation.

The distinction between memory of the first type in memory of the second type may rely on the areas of memory required by system modules. For example, the autonomous vehicle computing system may include a bootloader, which performs various system tasks, which may occur prior to system operation. The bootloader is configured to rely on one or more regions of memory to perform the bootloader's assigned tasks. Region of a memory dedicated to the bootloader, for example, must be scrubbed prior to system operation. These regions of memory will be designated as first type regions and will be scrubbed prior to system operation.

The operating system may be configured to run within a designated region of memory. Although the operating system may rely on other extraneous memory regions, such as RAM Disk, the functions of the operating system itself may be performed within one or more predetermined memory regions. Any such memory region or regions corresponding to the operation of the OS may be labeled as memory first type and designated for scrubbing prior to system operation.

Conversely, regions of memory claimed by the operating system for other tasks, such as the running of applications, RAM disk, or otherwise, may be designated as second type regions, and said regions may be reserved for scrubbing during or after system operation.

The one or more modules involved in performing the memory management tasks disclosed herein may be referred to as a fast boot configuration circuit. The fast boot configuration circuit may include any modules related to the designation of memory as memory of a first type or a second type, the scrubbing of memory of the first type, the delayed scrubbing of memory of the second type at or following system operation, and/or the setting of permissions for memory of the second type.

The principles disclosed herein allow for system operation following the scrubbing of memory of the first type, such that the system operation can be performed before memory of the second type has been scrubbed. This represents a departure from the known practice of memory scrubbing with autonomous vehicles.

During system initialization, the primary CPU may be unable to perform memory scrubbing tasks. In order to achieve completed memory scrubbing in a timely manner, one or more available CPUs may be recruited to perform memory scrubbing of the second type parallel to the system initialization actions of the primary CPU. Thus, during system initialization, memory may be scrubbed by other CPUs. These other CPUs may be CPUs that would otherwise be idle within the system initialization process, or the additional CPUs may be CPUs dedicated specifically for parallel memory scrubbing, without limitation.

The operating system may be loaded, even where memory of the second type remains unscrubbed. The one or more additional CPUs may continue to carry out scrubbing operations during the loading of the operating system.

Once the operating system is loaded, the operating system may assume any memory scrubbing tasks. The operating system may be configured to carry out memory scrubbing in the background, such that the operating system may operate one or more application stacks while carrying out memory scrubbing of the second type as resources are available.

The operating system may be configured to load one or more autonomous driving applications. The one or more autonomous driving applications may be loaded even where memory of the second type remains unscrubbed. It is anticipated that the one or more autonomous driving applications will be loaded and/or operated while any remaining memory of the second type to be scrubbed is scrubbed parallel or in the background, as resources are available. In permitting the operating system to load autonomous driving applications, even where memory of the second type remains unscrubbed, the autonomous driving applications may be loaded sooner, and therefore more likely to make autonomous driving features available within a given timing budget.

Once the memory of the second type is scrubbed, the caching policy corresponding to the memory of the second type may be changed. As previously described, prior to system operation, any unscrubbed memory is designated as uncacheable. This designation prohibits any data within the unscrubbed memory from being transferred to the system cache. Marking said portions of the DRAM memory as being uncacheable functions as a precaution or safety aspect. By changing the caching policy corresponding to these memory regions, they become available to the system and may function in the normal manner. According to one aspect of the disclosure, the change in memory caching policy is performed upon all memory of the second type once the memory of the second type has been scrubbed. According to another aspect of the disclosure, the change in the memory caching policy may be performed in phases as the memory is scrubbed. According to this aspect, groups of second type memory having been scrubbed may be designated as writeback even where additional regions of second type memory remain unscrubbed. These incremental changes from uncacheable to writeback may occur in any number of increments as desired for the given implementation.

The memory disclosed herein may be any type of memory capable of being overwritten or scrubbed, without limitation. According to one aspect of the disclosure, the memory may be Error Correction Code dynamic random access memory (ECC DRAM).

As described herein, memory of the first type may be any kind of memory required for system operation. This may include, without limitation, any memory required for bootloader operation and/or any memory required for an operating system. The second type of memory may be any memory that is not of the first type. The second type of memory may include, without limitation, any memory used in applications and/or memory used for RAM Disk. This may include any memory used in autonomous vehicle applications. Memory of the second type may include memory claimed for use by an operating system, as opposed to memory required for use by an operating system.

According to another aspect of the disclosure, the fast boot configuration circuit may further include a control configured to change an apportionment of memory regions among the first type and the second type. That is, the attribution of memory as memory of the first type and memory of the second type may rely on a number of conditions and/or criteria, which may permit various levels of tolerance in apportioning memory between a first type and a second type. Within these levels of tolerance, memory designated as memory of the first type may be larger or smaller, providing that the memory designated as memory of the first type is sufficiently large to allow for system initialization and system operation. Depending on the needs or desires of the installation, the memory resources designated as memory of the first type may be increased beyond that which is absolutely necessary, such that additional memory regions are scrubbed before beginning system operation. According to one aspect of the disclosure, the fast boot configuration circuit control may be adjustable to define the region designated as memory of the first type from an absolute minimum memory selection to the entirety of memory. Where the memory of the first type is altered, the regions designated as memory of the second type are similarly altered to correspond to the regions not designated as memory of the first type. According to one aspect of the disclosure, the control may be user adjustable. The user adjustability may allow vehicle manufacturers, for instance, to adjust memory designated as memory of the first type as desired for a given vehicle implementation. The controller may be in any format whatsoever, including, but not limited to, a knob, a slider, a button, a digital programmable resource, or any other control whatsoever capable of adjusting a region dedicated as a region of the first type.

According to another aspect of the disclosure, the region or regions of memory dedicated as memory of the first type may be held as small as possible to minimize a time between system startup and autonomous vehicle application initialization. The vehicle may be configured with an absolute minimum resource designation, wherein the smallest possible regions of memory are designated as regions of the first type.

As described herein, scrubbing may be understood to be clearing of a memory. This may be achieved by overwriting the memory, such as overwriting the memory with a known value. According to one aspect of the disclosure, scrubbing may be overwriting the memory with a zero. Scrubbing may alternatively be overwriting the memory with a one. Scrubbing may be performed, at least, to clear any residual data within the memory, so as to avoid copying of said residual data into the system cache.

In the following, various examples are provided with reference to the aspects described above.

In Example 1, a memory management system is disclosed comprising a memory; a boot configuration circuit, configured to designate one or more memory regions as a first type or a second type, the first type requiring scrubbing before system operation, and the second type permitting scrubbing after beginning system operation; one or more processors, configured to scrub the memory regions of the first type; define a first caching policy of one or more memory regions of the second type; and begin system operation before scrubbing memory regions of the second type.

In Example 2, the memory management system of Example 1 is disclosed, further comprising one or more additional processors, configured to scrub an unscrubbed region of memory of the second type during the system initialization.

In Example 3, the memory management system of Example 1 or 2 is disclosed, wherein the one or more primary processors are further configured to load an operating system upon completion of system initialization, and to cause the loaded operating system to scrub an unscrubbed region of memory of the second type.

In Example 4, the memory management system of Example 3 is disclosed, wherein the operating system is configured to load an autonomous driving application stack when one or more memory regions of the second type remain unscrubbed.

In Example 5, the memory management system of Example 4 is disclosed, wherein the operating system is further configured to scrub any unscrubbed regions of the second type in the background while loading the one or more autonomous driving applications.

In Example 6, the memory management system of any one of Examples 1 to 5 is disclosed, wherein the one or more primary processors are further configured to define a second caching policy for the one or more memory regions of the second type after scrubbing.

In Example 7, the memory management system of any one of Examples 1 to 6 is disclosed, wherein the memory is Error Correction Code DRAM memory.

In Example 8, the memory management system of any one of Examples 1 to 7 is disclosed, wherein the first type comprises memory dedicated to a bootloader.

In Example 9, the memory management system of any one of Examples 3 to 7 is disclosed, wherein the first type comprises memory dedicated to the operating system.

In Example 10, the memory management system of any one of Examples 3 to 9 is disclosed, wherein the first type comprises memory necessary for loading of the operating system.

In Example 11, the memory management system of any one of Examples 1 to 10 is disclosed, wherein the second type comprises memory used for one or more applications.

In Example 12, the memory management system of any one of Examples 1 to 11 is disclosed, wherein the second type comprises memory dedicated to a RAM Disk.

In Example 13, the memory management system of any one of Examples 3 to 12 is disclosed, wherein the second type comprises memory used by the operating system.

In Example 14, the memory management system of any one of Examples 1 to 13 is disclosed, wherein the first caching policy defines one or more unscrubbed memory regions as being uncacheable.

In Example 15, the memory management system of any one of Examples 1 to 14 is disclosed, wherein the second caching policy defines one or more unscrubbed memory regions as being writeback regions.

In Example 16, the memory management system of any one of Examples 1 to 15 is disclosed, wherein the boot configuration circuit further comprises a control to change an apportionment of the one or more memory regions among a first type and a second type.

In Example 17, the memory management system of Example 16 is disclosed, wherein the control is configured to be adjustable.

In Example 18, the memory management system of Example 16 or 17 is disclosed, wherein the control is a knob.

In Example 19, the memory management system of any one of Examples 1 to 18 is disclosed, wherein the boot configuration circuit is further configured to minimize the memory of the first type.

In Example 20, the memory management system of any one of Examples 1 to 19 is disclosed, wherein scrubbing comprises overwriting one or more memory regions with a known value.

In Example 21, the memory management system of Example 20 is disclosed, wherein the known value is zero.

In Example 22, a method for memory management is disclosed, comprising:

designating one or more memory regions as a first type or a second type, the first type requiring scrubbing before beginning system operation, and the second type permitting scrubbing after beginning system operation; scrubbing the memory regions of the first type; defining a first caching policy of one or more memory regions of the second type; and beginning system operation before scrubbing memory regions of the second type.

In Example 23, the method for memory management of Example 22 is disclosed, further comprising scrubbing an unscrubbed region of memory of the second type during the system initialization.

In Example 24, the method for memory management of Example 22 or 23 is disclosed, further comprising loading an operating system upon completion of system initialization, and causing the loaded operating system to scrub an unscrubbed region of memory of the second type.

In Example 25, the method for memory management of Example 24 is disclosed, further comprising loading an autonomous driving application stack when one or more memory regions of the second type remain unscrubbed.

In Example 26, the method for memory management of Example 25 is disclosed, further comprising scrubbing any unscrubbed regions of the second type in the background while loading the one or more autonomous driving applications.

In Example 27, the method for memory management of any one of Examples 22 to 26 is disclosed, further comprising defining a second caching policy for the one or more memory regions of the second type after scrubbing.

In Example 28, the method for memory management of any one of Examples 22 to 27 is disclosed, wherein the memory is Error Correction Code DRAM memory.

In Example 29, the method for memory management of any one of Examples 22 to 28 is disclosed, wherein the first type comprises memory dedicated to a bootloader.

In Example 30, the method for memory management of any one of Examples 22 to 28 is disclosed, wherein the first type comprises memory dedicated to the operating system.

In Example 31, the method for memory management of any one of Examples 22 to 30 is disclosed, wherein the first type comprises memory necessary for loading of the operating system.

In Example 32, the method for memory management of any one of Examples 22 to 31 is disclosed, wherein the second type comprises memory used for one or more applications.

In Example 33, the method for memory management of any one of Examples 22 to 32 is disclosed, wherein the second type comprises memory dedicated to a RAM Disk.

In Example 34, the method for memory management of any one of Examples 22 to 33 is disclosed, wherein the second type comprises memory used by the operating system.

In Example 35, the method for memory management of any one of Examples 22 to 34 is disclosed, wherein the first caching policy defines one or more unscrubbed memory regions as being uncacheable.

In Example 36, the method for memory management of any one of Examples 22 to 35 is disclosed, wherein the second caching policy defines one or more unscrubbed memory regions as being writeback regions.

In Example 37, the method for memory management of any one of Examples 22 to 36 is disclosed, further comprising changing an apportionment of the one or more memory regions among a first type and a second type.

In Example 38, the method for memory management of any one of Examples 22 to 37 is disclosed, wherein scrubbing comprises overwriting one or more memory regions with a known value.

In Example 39, the method for memory management of Example 38 is disclosed, wherein the known value is zero.

In Example 40, a memory management means is disclosed comprising a storage means; a boot configuration means, configured to designate one or more storage means regions as a first type or a second type, the first type requiring scrubbing before beginning system operation, and the second type permitting scrubbing after beginning system operation; one or more primary processing means, configured to scrub the storage means regions of the first type; define a first caching policy of one or more storage means regions of the second type; and begin system operation before scrubbing storage means regions of the second type.

In Example 41, the memory management means of Example 40 is disclosed, further comprising one or more additional processing means, configured to scrub an unscrubbed region of storage means of the second type during the means initialization.

In Example 42, the memory management means of Example 40 or 41 is disclosed, wherein the one or more primary processing means are further configured to load an operating system upon completion of means initialization, and to cause the loaded operating system to scrub an unscrubbed region of storage means of the second type.

In Example 43, the memory management means of Example 42 is disclosed, wherein the operations means is configured to load an autonomous driving application stack when one or more storage means regions of the second type remain unscrubbed.

In Example 44, the memory management means of Example 43 is disclosed, wherein the operating system is further configured to scrub any unscrubbed regions of the second type in the background while loading the one or more autonomous driving applications.

In Example 45, the memory management means of any one of Examples 40 to 44 is disclosed, wherein the one or more primary processing means are further configured to define a second caching policy for the one or more storage means regions of the second type after scrubbing.

In Example 46, the memory management means of any one of Examples 40 to 45 is disclosed, wherein the storage means is DRAM.

In Example 47, the memory management means of any one of Examples 40 to 46 is disclosed, wherein the first type comprises storage means dedicated to a bootloader.

In Example 48, the memory management means of any one of Examples 40 to 46 is disclosed, wherein the first type comprises storage means dedicated to the operating system.

In Example 49, the memory management means of any one of Examples 40 to 48 is disclosed, wherein the first type comprises storage means necessary for loading of the operating system.

In Example 50, the memory management means of any one of Examples 40 to 49 is disclosed, wherein the second type comprises storage means used for one or more applications.

In Example 51, the memory management means of any one of Examples 40 to 50 is disclosed, wherein the second type comprises storage means dedicated to a RAM Disk.

In Example 52, the memory management means of any one of Examples 40 to 51 is disclosed, wherein the second type comprises storage means used by the operating system.

In Example 53, the memory management means of any one of Examples 40 to 52 is disclosed, wherein the first caching policy defines one or more unscrubbed storage means regions as being uncacheable.

In Example 54, the memory management means of any one of Examples 40 to 53 is disclosed, wherein the second caching policy defines one or more unscrubbed storage means regions as being writeback regions.

In Example 55, the memory management means of any one of Examples 40 to 54 is disclosed, wherein the boot configuration means further comprises a control to change an apportionment of the one or more storage means regions among a first type and a second type.

In Example 56, the memory management means of Example 55 is disclosed, wherein the control is configured to be user adjustable.

In Example 57, the memory management means of Example 55 or 56 is disclosed, wherein the control is a knob.

In Example 58, the memory management means of any one of Examples 40 to 57 is disclosed, wherein the boot configuration means is further configured to minimize the storage means of the first type.

In Example 59, the memory management means of any one of Examples 40 to 58 is disclosed, wherein scrubbing comprises overwriting one or more storage means regions with a known value.

In Example 60, the memory management means of Example 59 is disclosed, wherein the known value is zero.

In Example 61, a non-transient computer readable medium is disclosed, configured to perform the method of designating one or more memory regions as a first type or a second type, the first type requiring scrubbing before beginning system operation, and the second type permitting scrubbing after beginning system operation; scrubbing the memory regions of the first type; defining a first caching policy of one or more memory regions of the second type; and beginning system operation before scrubbing memory regions of the second type.

In Example 62, a non-transient computer readable medium configured to perform the method of any one of Examples 22-39 is disclosed.

In Example 63, the memory management system of Example 1 is disclosed, further comprising defining a second caching policy of one or more memory regions of the first type; and beginning system operation after scrubbing memory regions of the first type.

In Example 64, the memory management system of Example 1 is disclosed, wherein the first type comprises memory necessary for loading the autonomous driving application.

In Example 65, the memory management system of Example 1 is disclosed, wherein beginning system operation comprises performing one or more auto-bootloader operations.

In Example 66, the memory management system of Example 1 is disclosed, wherein beginning system operation comprises beginning a system initialization.

In Example 67, the memory management system of Example 1 is disclosed, wherein beginning system operation comprises loading the operating system.

In Example 68, the memory management system of any one of the above Examples is disclosed, wherein the system is configured as an apparatus or circuit.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A memory management system comprising:
a memory;
a boot configuration circuit, configured to designate one or more memory regions as one or more memory regions of a first type and one or more memory regions of a second type, the one or more memory regions of the first type requiring scrubbing before beginning system boot up, and the one or more memory regions of the second type permitting scrubbing to first be started after beginning system boot up;
one or more first processors, configured to
  scrub the one or more memory regions of the first type;
  define a first caching policy of the one or more memory regions of the second type; and
  begin system boot up after the one or more memory regions of the first type are scrubbed but before the one or more memory regions of the second type are scrubbed;
one or more second processors, configured to
  scrub at least one of the one or more memory regions of the second type during system boot up;
wherein the one or more first processors are distinct from the one or more second processors; and wherein the one or more first processors cease memory scrubbing during system boot up.

2. The memory management system of claim 1, wherein the one or more first processors are further configured to load an operating system upon completion of system boot up, and to cause the loaded operating system to scrub an unscrubbed region of memory of the second type.

3. The memory management system of claim 2, wherein the one or more memory regions of the first type comprise memory dedicated to the operating system.

4. The memory management system of claim 2, wherein the one or more memory regions of the first type comprise memory necessary for loading of the operating system.

5. The memory management system of claim 2, wherein the operating system is configured to load an autonomous driving application stack when one or more memory regions of the second type remain unscrubbed.

6. The memory management system of claim 5, wherein the operating system is further configured to scrub any unscrubbed regions of the second type in the background while loading the one or more autonomous driving applications.

7. The memory management system of claim 1, wherein the one or more first processors are further configured to define a second caching policy for the one or more memory regions of the second type after scrubbing.

8. The memory management system of claim 1, wherein the memory is Error Correction Code DRAM memory.

9. The memory management system of claim 1, wherein the one or more memory regions of the first type comprise memory dedicated to a bootloader.

10. The memory management system of claim 1, wherein the memory regions of the second type comprise memory used for one or more applications.

11. The memory management system of claim 1, wherein the memory regions of the second type comprise memory dedicated to a RAM Disk.

12. The memory management system of claim 1, wherein the first caching policy defines one or more unscrubbed memory regions as being uncacheable.

13. The memory management system of claim 1, wherein the one or more first processors are further configured to define a second caching policy for the one or more memory regions of the second type after scrubbing, and wherein the second caching policy defines the one or more memory regions of the second type as being writeback regions.

14. The memory management system of claim 1, wherein the boot configuration circuit further comprises a control to change an apportionment of the one or more memory regions among the one or more memory regions of the first type and the one or more memory regions of the second type.

15. The memory management system of claim 14, wherein the control is configured to be adjustable.

16. The memory management system of claim 1, wherein scrubbing comprises overwriting one or more memory regions with a known value.

17. The memory management system of claim 1, wherein at least one of the one or more first processors both scrubs the one or more memory regions of the first type and begins system boot up.

18. The memory management system of claim 1, wherein the one or more first processors pause scrubbing during system boot up and the one or more second processors begin scrubbing during system boot up.

19. A method for memory management comprising:
designating one or more memory regions as one or more memory regions of a first type and one or more memory regions of a second type, the one or more memory regions of the first type requiring scrubbing before beginning system boot up, and the one or more memory regions of the second type permitting scrubbing to first be started after beginning system boot up;
scrubbing the one or more memory regions of the first type with a first set of one or more processors;
defining a first caching policy of the one or more memory regions of the second type; and
beginning system boot up after the one or more memory regions of the first type are scrubbed but before the one or more memory regions of the second type are scrubbed;
scrubbing at least one of the one or more memory regions of the second type with a second set of one or more processors;
wherein the first set of one or more processors is distinct from the second set of one or more processors; and
wherein the one or more first processors cease memory scrubbing during system boot up.

20. The method for memory management of claim 19, further comprising loading an operating system upon completion of system boot up, and causing the loaded operating system to scrub an unscrubbed region of memory of the second type.

* * * * *